United States Patent
Park et al.

(10) Patent No.: US 7,012,366 B2
(45) Date of Patent: Mar. 14, 2006

(54) ORGANIC ELECTROLUMINESCENCE DISPLAY PANEL INCLUDING CELL GAP AND METHOD OF FABRICATING THE SAME

(75) Inventors: Jae Yong Park, Gyeonggi-do (KR); Choong Keun Yoo, Incheon (KR); Ock Hee Kim, Gyeonggi-do (KR); Nam Yang Lee, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 175 days.

(21) Appl. No.: 10/330,257

(22) Filed: Dec. 30, 2002

(65) Prior Publication Data

US 2003/0178936 A1 Sep. 25, 2003

(30) Foreign Application Priority Data

Mar. 20, 2002 (KR) .................... 10-2002-0015138

(51) Int. Cl.
*H01J 1/62* (2006.01)
(52) U.S. Cl. ...................... 313/505; 313/512
(58) Field of Classification Search ........ 313/502–507, 313/509, 511, 512, 498; 498/690
See application file for complete search history.

(56) References Cited

U.S. PATENT DOCUMENTS

| | | | | | |
|---|---|---|---|---|---|
| 5,294,869 | A | * | 3/1994 | Tang et al. ................. | 313/504 |
| 5,294,870 | A | * | 3/1994 | Tang et al. ................. | 313/504 |
| 5,705,285 | A | * | 1/1998 | Shi et al. ................... | 428/690 |
| 5,909,081 | A | * | 6/1999 | Eida et al. .................. | 313/504 |
| 5,962,970 | A | * | 10/1999 | Yokoi et al. ................ | 313/506 |
| 6,019,654 | A | * | 2/2000 | Kim .......................... | 445/24 |
| 6,084,347 | A | * | 7/2000 | Xu et al. .................... | 313/503 |
| 6,111,355 | A | * | 8/2000 | Inoue et al. ................ | 313/506 |
| 6,137,220 | A | * | 10/2000 | Nagayama et al. ......... | 313/504 |
| 6,175,345 | B1 | | 1/2001 | Kuribayashi et al. | |
| 6,281,634 | B1 | * | 8/2001 | Yokoyama ................ | 315/169.3 |
| 6,392,340 | B1 | * | 5/2002 | Yoneda et al. ............. | 313/506 |
| 6,548,961 | B1 | | 4/2003 | Barth et al. | |
| 6,580,214 | B1 | * | 6/2003 | Yoneda et al. ............. | 313/506 |
| 6,608,449 | B1 | * | 8/2003 | Fukunaga ................. | 315/169.3 |
| 6,633,134 | B1 | * | 10/2003 | Kondo et al. ............. | 315/169.3 |
| 6,641,933 | B1 | * | 11/2003 | Yamazaki et al. .......... | 428/690 |

(Continued)

FOREIGN PATENT DOCUMENTS

JP 2001-177509 4/2001

(Continued)

*Primary Examiner*—Joseph Williams
*Assistant Examiner*—Dalei Dong
(74) *Attorney, Agent, or Firm*—Morgan Lewis & Bockius LLP (57) ABSTRACT

An organic electroluminescent device includes first and second substrates attached by a seal pattern, array elements having a plurality of switching devices on the first substrate; a color changing medium on a rear surface of the second substrate, wherein the color changing medium has a black matrix that defines sub-pixel regions and has red, green and blue color changing layers respectively corresponding to the sub-pixel regions, a planarizing layer on the color changing medium, a first electrode on a rear surface of the planarizing layer, an organic electroluminescent layer on a rear surface of the first electrode, second electrodes on a rear surface of the organic electroluminescent layer that correspond to respective sub-pixel regions, and a plurality of electrical connectors between the first and second substrates, wherein electrical connectors connect the array elements on the first substrate to the second electrodes on the second substrate, respectively.

15 Claims, 9 Drawing Sheets

U.S. PATENT DOCUMENTS

| | | | |
|---|---|---|---|
| 6,664,732 B1 * | 12/2003 | Yamazaki et al. | 313/506 |
| 6,744,197 B1 * | 6/2004 | Park et al. | 313/504 |
| 6,787,249 B1 * | 9/2004 | Seo | 428/690 |
| 6,831,407 B1 * | 12/2004 | Cok | 313/504 |
| 6,835,950 B1 * | 12/2004 | Brown et al. | 257/40 |
| 6,870,186 B1 * | 3/2005 | Park et al. | 257/59 |
| 6,927,536 B1 * | 8/2005 | Kim et al. | 313/504 |
| 6,933,574 B1 * | 8/2005 | Park et al. | 257/359 |
| 2002/0158577 A1 | 10/2002 | Shimoda et al. | |

FOREIGN PATENT DOCUMENTS

| | | |
|---|---|---|
| KR | 2002-0047889 | 6/2002 |
| KR | 2004-0079476 | 9/2004 |
| WO | WO-02/078101 | 10/2005 |

* cited by examiner

*FIG. 1*
*(RELATED ART)*

Light-emitting Direction

ORGANIC ELECTROLUMINESCENCE DISPLAY PANEL INCLUDING CELL GAP AND METHOD OF FABRICATING THE SAME

The present application claims the benefit of Korean Patent Application No. 2002-15138 filed in Korea on Mar. 20, 2002, which is hereby incorporated by reference.

BACKGROUND OF THE INVENTION

1. Field of the Invention

The present invention relates to organic electroluminescent devices, and more particularly, to a top emission type active matrix organic electroluminescent device.

2. Discussion of the Related Art

Flat panel display devices—which are characterized as being thin, light weight and energy efficient—are in high demand in the display field as the information age rapidly evolves. A flat panel display device can be classified into one of two types depending on whether it emits or receives light. One type is a light-emitting type display device that emits light to display images, and the other type is a light-receiving type display device that uses an external light source to display images. Plasma display panels, field emission display devices, and electroluminescence display devices are examples of the light-emitting type display devices. Liquid crystal displays are examples of the light-receiving type display device.

Among the flat panel display devices, liquid crystal display (LCD) devices are widely used for laptop computers and desktop monitors because of their high resolution, good color rendering and superior image quality. However, the LCD device has some disadvantages, such as poor contrast ratio, narrow viewing angle, and difficulty in enlarging it to a very large size having millions of pixels. Therefore, new types of flat panel displays are needed to overcome the aforementioned disadvantages, but yet are still thin, light weight and have low power consumption.

Recently, organic electroluminescent display (OED) devices have been of the most interest in research and development because they are light-emitting type display devices having a wide viewing angle and a good contrast ratio as compared to the LCD device. The organic electroluminescent display device is a light-emitting type display device that does not require a backlight device, and can be light weight and thin. Further, the organic electroluminescent display device has low power consumption. A low voltage direct current can be used to drive the organic electroluminescent display device while obtaining a rapid response speed. As widely known, since the organic electroluminescent display device is totally in solid phase, unlike the LCD device, an OED device is sufficiently strong to withstand external impacts and has a greater operational temperature range. In addition, the organic electroluminescent display device can be manufactured at a lower cost than a LCD device. Moreover, since only the deposition and encapsulation apparatuses are necessary without having to inject liquid crystal in a process of manufacturing the organic electroluminescent display device, process management is simpler than in the manufacture of LCD devices.

One operating method for the organic electroluminescent display device is a passive matrix operating method that does not utilize thin film transistors. In this type of organic electroluminescent display device, scanning lines and signal lines, which are arranged in a matrix pattern, perpendicularly cross each other. A scanning voltage is sequentially applied to the scanning lines to operate each pixel. To obtain a required average luminance, the instantaneous luminances of each pixel during a selected period is intensified by increasing the number of scans during the period.

Another method of operating an organic electroluminescent display device is an active matrix operating method. The active matrix type organic electroluminescent display device usually includes thin film transistor pairs, which create a voltage storing capability for each of the pixels. The pair of thin film transistors includes a selection transistor and a drive transistor. The source/drain of the selection transistor is connected to a signal line for supplying a data signal when a scanning signal is applied to the gate scanning line. The gate of the drive transistor is connected to the drain/source of the selection transistor. A constant voltage line is connected to the source/drain of the drive transistor. In the structure of an active matrix type organic electroluminescent display device, a voltage applied to the pixels is stored in storage capacitors, thereby maintaining the signals until the next period for applying a signal voltage. As a result, a substantially constant current flows through the pixels, and the organic electroluminescent display device emits light at a substantially constant luminance during one frame period. Because a very low current is applied to each pixel of an active matrix type organic electroluminescent display, it is possible to enlarge the display device, thereby forming much finer and/or larger patterns having low power consumption.

Figure 1:
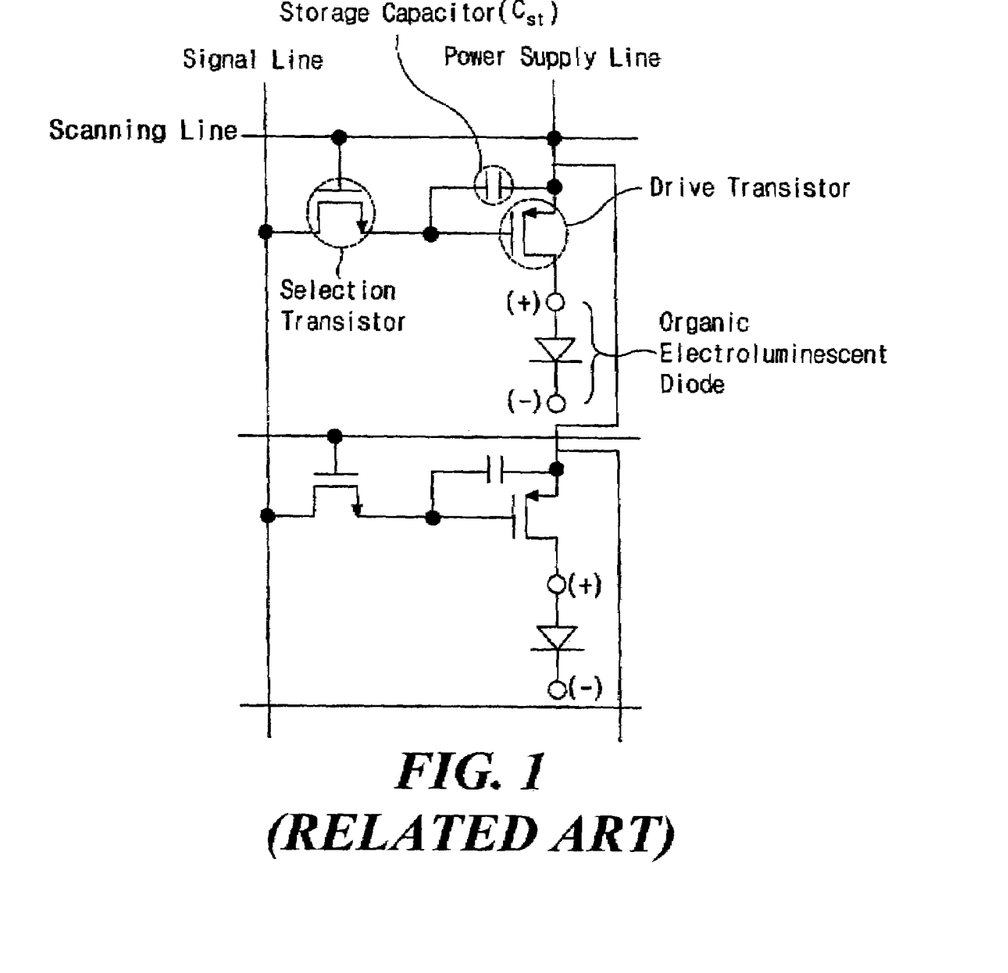
FIG. 1 shows an equivalent circuit diagram of pixels in the active matrix type organic electroluminescent display device according to the related art.

The driving principle for a display apparatus according to the related art will now be described in FIG. 1 that shows an equivalent circuit diagram of pixels in the active matrix type organic electroluminescent display device in the related art. As shown in FIG. 1, scanning lines are arranged in a transverse direction, and signal lines are arranged in a longitudinal direction perpendicular to the scanning lines. A power supply line that is connected to a power supply provides a voltage to drive transistors and is also disposed in the longitudinal direction. A pixel is defined between a pair of signal lines and a pair of scanning lines. Each selection transistor, otherwise known as a switching thin film transistor (TFT), is disposed in the pixel near the crossing of the scanning line and signal line and acts as an addressing element that controls the voltage of a pixel. A storage capacitor $C_{ST}$ is connected to the power supply line and the drain/source of the switching TFT. Each drive transistor, otherwise known as a driving TFT has a gate electrode connected to the storage capacitor $C_{ST}$ and a source/drain connected to the power supply line and acts as a current source element for the pixel. An organic electroluminescent diode is connected to the drain/source of drive transistor.

The organic electroluminescent diode has a multi-layer structure of organic thin films between an anode electrode and a cathode electrode. When forward current is applied to the organic electroluminescent diode, electron-hole pairs combine in an organic electroluminescent layer as a result of a P-N junction between the anode electrode, which provides holes, and the cathode electrode, which provides electrons. The electron-hole pairs have a lower energy together when combined than when they were separated. The energy gap between combined and separated electron-hole pairs is converted into light by an organic electroluminescent element. That is, the organic electroluminescent layer emits the energy generated due to the recombination of electrons and holes when a current flows.

Organic electroluminescent devices are classified into a top emission type and a bottom emission type in accordance with a progressive direction of light emitted from the organic electroluminescent diode. In the bottom emission type device, light is emitted in a direction toward the substrate where the various lines and TFTs are disposed. However, in the top emission type device, light is emitted in a direction opposite to the substrate where the lines and TFTs are disposed.

Figure 2:
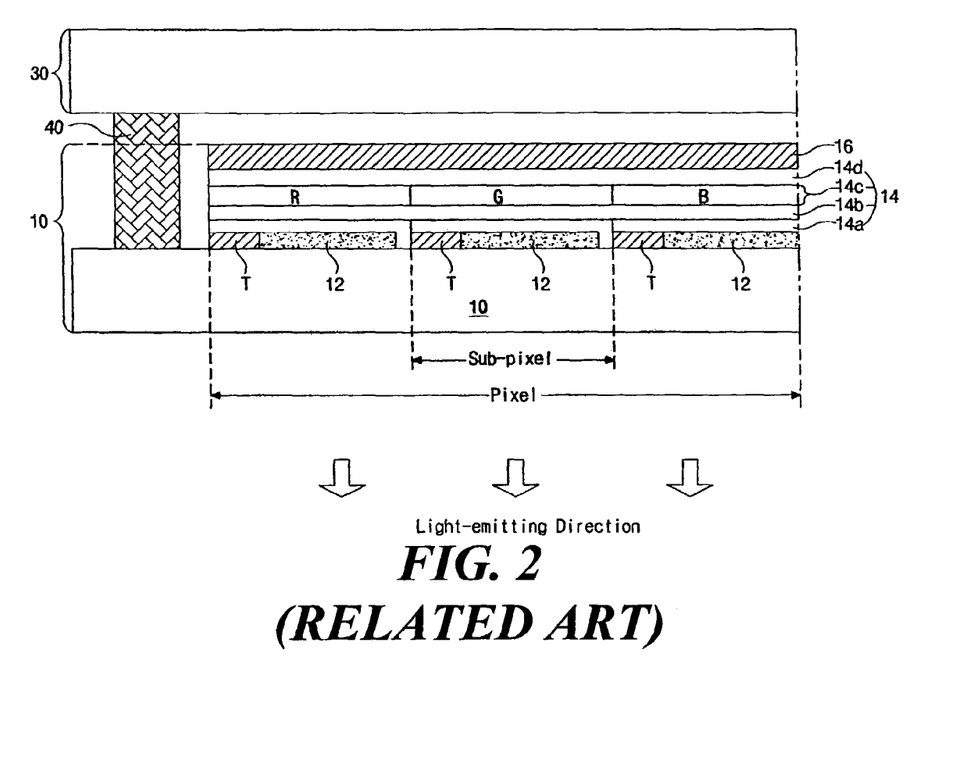
FIG. 2 is a partial cross-sectional view of a bottom emission type organic electroluminescent device showing one pixel having red (R), green (G) and blue (B) sub-pixel regions according to the related art.

FIG. 2 is a partial cross-sectional view of a bottom emission type organic electroluminescent device showing one pixel having red (R), green (G), and blue (B) sub-pixels regions according to the related art. As shown in FIG. 2, first and second substrates 10 and 30 are spaced apart from each other. The first and second substrates 10 and 30 are attached to each other and sealed by a seal pattern 40. Thin film transistors T and first electrodes 12 are formed on the first substrate 10, which is transparent. The pixel of the organic electroluminescent device generally includes three sub-pixel regions with the thin film transistor T and the first electrode 12 disposed in each sub-pixel region. An organic electroluminescent layer 14 is formed over the thin film transistors T and over the first electrodes 12. The organic electroluminescent layer 14 includes luminous materials that produce red (R), green (G), and blue (B) colors each corresponding to each thin film transistor T in each sub-pixel region. A second electrode 16 is formed on the organic electroluminescent layer 14. The first and second electrodes 12 and 16 supply the electric charges to the organic electroluminescent layer 14.

The seal pattern 40 attaches the first and second substrates 10 and 30 and maintains a cell gap between the first and second substrates 10 and 30. Furthermore, although not shown in FIG. 2, a hydroscopic material or a moisture absorbent material can be formed on an inner surface of the second substrate 30 in order to absorb the moisture within the cell gap between the first and second substrates 10 and 30 to protect the cell gap from moisture. In addition, a translucent tape may be interposed between the second substrate 30 and the hydroscopic material to tightly adhere the hydroscopic material to the second substrate 30.

In the related art shown in FIG. 2, if the first electrode 12 is an anode and the second electrode 16 is a cathode, the first electrode 12 is formed of a transparent conductive material and the second electrode 16 is formed of a metal having a small work function. The organic electroluminescent layer 14 includes a hole injection layer 14a, a hole transporting layer 14b, an emission layer 14c, and an electron transporting layer 14d in sequential order from the first electrode 12. As mentioned before, the emission layer 14c includes luminous materials that emit red (R), green (G), and blue (B) colors in the corresponding sub-pixel regions.

Figure 3:
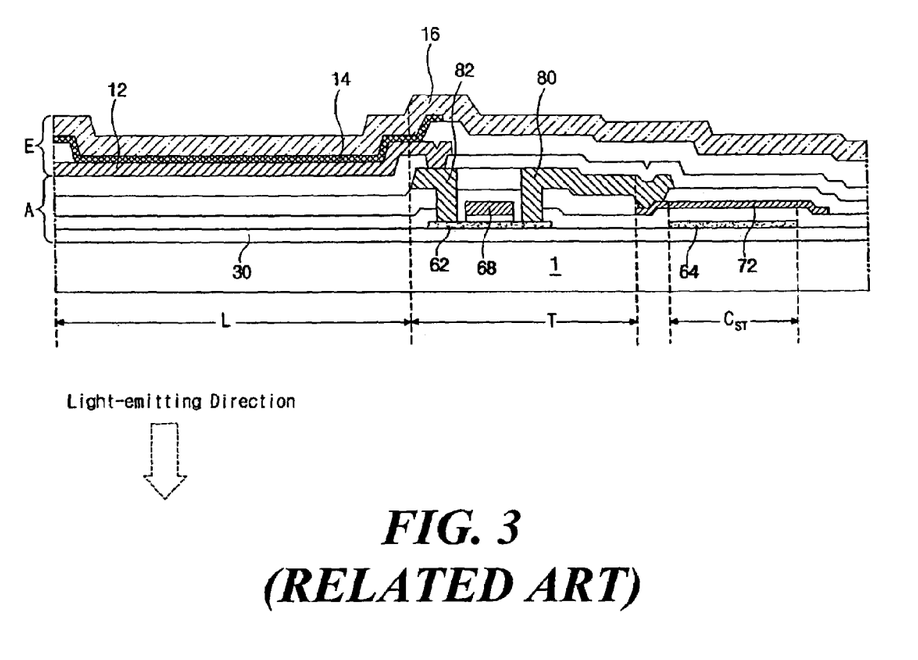
FIG. 3 is an enlarged cross-sectional view of one pixel of the bottom emission type organic electroluminescent display device shown in FIG. 2 according to the related art.

FIG. 3 is an enlarged cross-sectional view of one pixel region of the bottom emission type organic electroluminescent display device shown in FIG. 2. In FIG. 3, an organic electroluminescent display device generally includes a thin film transistor (TFT) T and an organic electroluminescent diode E in a luminous emitting area L. A buffer layer 30 is formed on a transparent substrate 1. The TFT T includes a semiconductor layer 62 on the buffer layer 30, a gate electrode 68, a source electrode 82, and a drain electrode 80. A power electrode 72 extending from the power supply line is connected to the source electrode 80, and the organic electroluminescent diode E is connected to the drain electrode 82. A capacitor electrode 64 made of the same material as the semiconductor layer 62 is disposed below the power electrode 72. The power electrode 72 corresponds to the capacitor electrode 64, and an insulator is interposed therebetween, thereby forming a storage capacitor $C_{ST}$.

The organic electroluminescent diode E includes the first electrode 12, the second electrode 16, and the organic electroluminescent layer 14 interposed between the first electrode 12 and the second electrode 16. The organic electroluminescent device shown in FIG. 3 has a luminous area L where the organic electroluminescent diode E emits light produced therein. Furthermore, the organic electroluminescent display device has array elements A that include the TFT T, the storage capacitor $C_{ST}$, the various lines and the various insulators, and on which the organic electroluminescent diode E is disposed. In the related art shown in FIG. 3, the organic electroluminescent diode E and the array elements A are formed on the same substrate.

Figure 4:
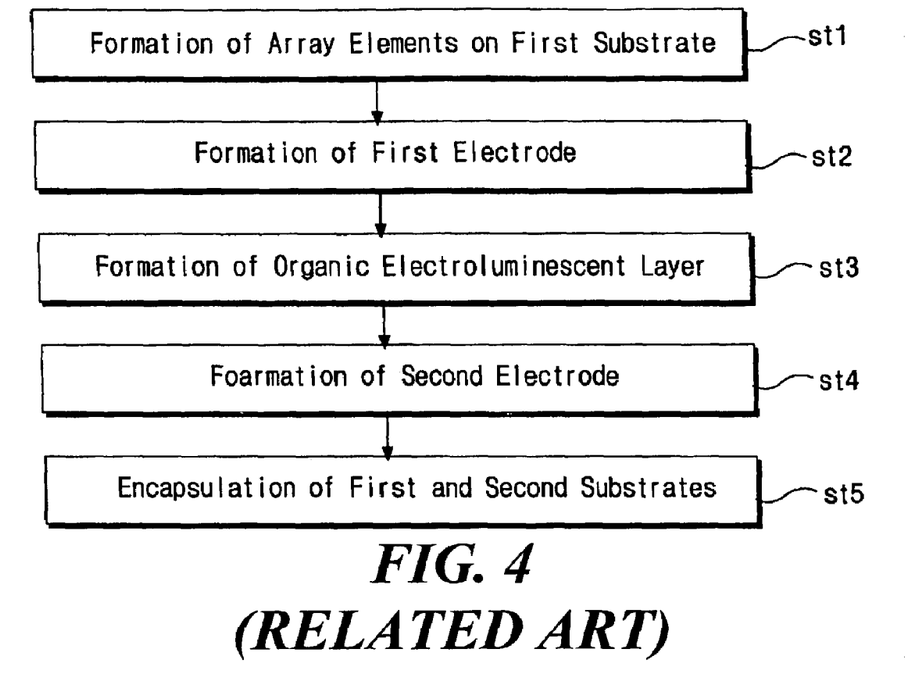
FIG. 4 is a flow chart illustrating a fabrication process of the organic electroluminescent device shown in FIG. 3 according to the related art.

FIG. 4 is a flow chart illustrating a fabrication process of an organic electroluminescent device of FIG. 3 according to the related art. Step st1 denotes a process of forming the array elements on the first substrate in which the first substrate is a transparent substrate. For example, the scanning lines, the signal lines, and the switching and driving thin film transistors are formed on and over the first substrate. The signal lines are formed perpendicularly across the scanning lines. Each of the switching thin film transistors is disposed near a crossing of the scanning and signal lines. The formation of the array elements also includes forming the storage capacitors and the power supply lines.

In step st2 of FIG. 4, the first electrode of the organic electroluminescent diode is formed. The first electrode is in each sub-pixel region. The first electrode is also connected to the drain/source of the driving thin film transistor in each sub-pixel region.

In step st3 of FIG. 4, the organic electroluminescent layer is formed on the first electrode. If the first electrode is the anode, the organic electroluminescent layer is formed to have a sequential multiple structure of a hole injection layer, a hole transporting layer, an emission layer, and an electron transporting layer on the first electrode. If the first electrode is the cathode, the sequence is reversed.

In step st4 of FIG. 4, the second electrode of the organic electroluminescent diode is formed on the organic electroluminescent layer. The second electrode covers the entire surface of the first substrate. The second electrode also acts as a common electrode.

Figure 5:
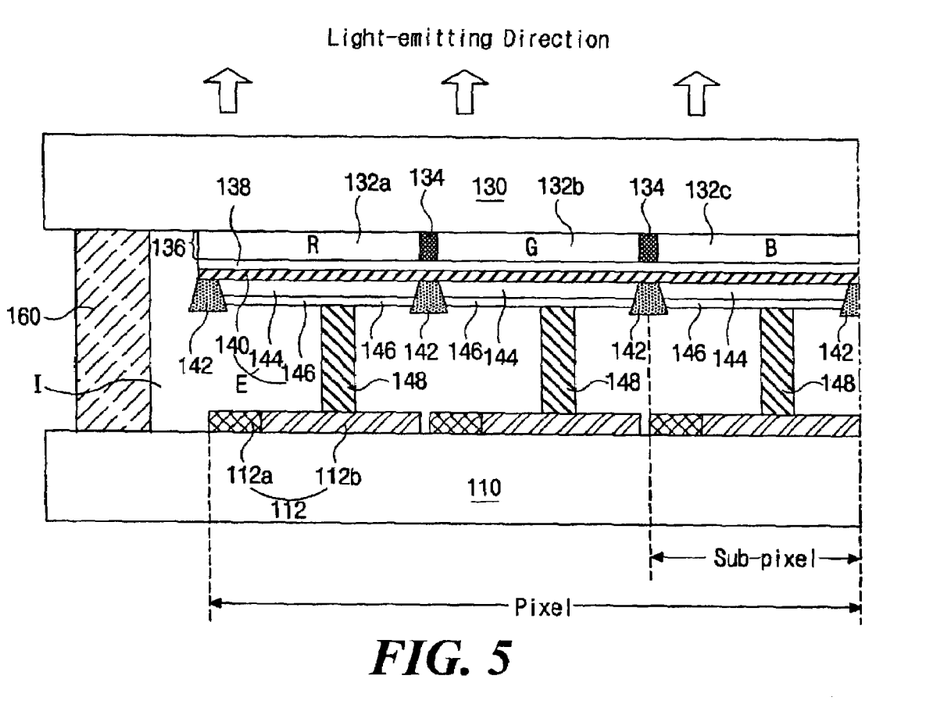
FIG. 5 is a partial cross-sectional view of a top emission type organic electroluminescent display device showing one pixel according to a first embodiment of the present invention.

Step st5 of FIG. 5 is a process step for encapsulating the first and second substrates. In this step st5, a second substrate is attached to the first substrate having the array elements and the organic electroluminescent diode. The second substrate protects the organic electroluminescent diode of the first substrate from external impacts. Because the first substrate is encapsulated with the second substrate, the organic electroluminescent diode is protected from the outer atmosphere. As mentioned before, the second substrate can have the hydroscopic material on the inner surface thereof.

The yield of array elements by the yield of organic electroluminescent layer. The fabrication yield of organic electroluminescent layer determines and controls the total fabrication yield of organic electroluminescent layer. For example, although the thin film transistors are formed without any defects on the first substrate, the first substrate having both the array elements and the organic electroluminescent layer is decided to be an inferior product if some defects occur in later processes for forming the organic electroluminescent layer. Thus, it is a waste of time and cost to fabricate the array substrate on the first substrate when defects later occur in the organic electroluminescent layer during the fabrication.

Moreover, in the bottom emission type device, light is emitted in a direction toward the substrate where the lines and TFTs are disposed. Therefore, the display area decreases because the emitted light is blocked by these lines and TFTs. In the top emission type device, since light is emitted in a direction opposite to the substrate where the lines and TFTs are disposed, the display area can increase as much as it can, and it is easy to design the TFT into a designated shape. However, since the top emission type organic electroluminescent display device of the conventional related art has the cathode electrode on the organic electroluminescent layer, the cathode electrode is generally formed of a transparent or translucent material that may block some of the light emitted from the organic electroluminescent layer that decreases light efficiency.

To prevent the decrease of the light permeability, a thin film passivation layer may be formed over the entire surface of the substrate. However, in this case of forming the thin film passivation layer, the outer atmosphere is not prevented sufficiently and may affect the organic electroluminescent diode.

SUMMARY OF THE INVENTION

Accordingly, the present invention is directed to an organic electroluminescent device that substantially obviates one or more of the problems due to limitations and disadvantages of the related art.

An object of the present invention is to provide a method of an active matrix organic electroluminescent display device which improves fabrication yield.

Another object is an active matrix organic electroluminescent display device having an improved resolution and a high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates attached by a seal pattern, array elements including a plurality of switching devices on the first substrate, a color changing medium on a rear surface of the second substrate, wherein the color changing medium has a black matrix that defines sub-pixel regions and has red, green and blue color changing layers respectively corresponding to the sub-pixel regions, a planarizing layer on the color changing medium, a first electrode on a rear surface of the planarizing layer, an organic electroluminescent layer on a rear surface of the first electrode, second electrodes on a rear surface of the organic electroluminescent layer that correspond to respective sub-pixel regions, and a plurality of electrical connectors between the first and second substrates, wherein electrical connectors connect an array elements on the first substrate to second electrodes on the second substrate, respectively.

In another aspect, a method of forming an organic electroluminescent device having first and second substrates includes forming array elements including a plurality of switching devices on the first substrate, forming a color changing medium on a rear surface of the second substrate, wherein the color changing medium has a black matrix that defines sub-pixel regions and has red, green and blue color changing layers respectively corresponding to the sub-pixel regions, forming a planarizing layer on the color changing medium; forming a first electrode on a rear surface of the planarizing layer, forming electrode separators on the first electrode, wherein the electrode separators corresponds in position to the black matrix and form intervals corresponding to the sub-pixel regions, forming organic electroluminescent layers on the first electrode and into the intervals between the electrode separators forming second electrodes respectively on rear surfaces of the organic electroluminescent layers that correspond to respective sub-pixel regions, forming a plurality of electrical connectors between the first and second substrates, and attaching the first and second substrates such that the electrical connectors connect an array elements on the first substrate to second electrodes on the second substrate, respectively.

In another aspect, a method of forming an organic electroluminescent device having first and second substrates includes forming array elements including a plurality of switching devices on the first substrate, forming a color changing medium on a rear surface of the second substrate, wherein the color changing medium has a black matrix that defines sub-pixel regions and has red, green, and blue color changing layers respectively corresponding to the sub-pixel regions, forming a planarizing layer on the color changing medium; forming a first electrode on a rear surface of the planarizing layer, forming an organic electroluminescent layer on the first electrode; depositing second electrodes on the organic electroluminescent layer using a shadow mask process such that the second electrodes respectively correspond to the sub-pixel regions, forming a plurality of electrical connectors between the first and second substrates; and attaching the first and second substrates such that the electrical connectors connect array elements on the first substrate to second electrodes on the second substrate, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings. Wherever possible, similar reference numbers will be used throughout the drawings to refer to the same or like parts in the embodiments.

The present invention provides an active matrix organic electroluminescent display device that has an improved fabrication yield, a better resolution and a high aperture ratio. In embodiments of the present invention, array elements, such as thin film transistors, and organic electroluminescent diodes are formed on separate substrates, respectively. To simplify the fabrication process of the organic electroluminescent display device, a shadow mask process can be omitted when forming an electrode of the organic electroluminescent diode. The organic electroluminescent display device can display full-color images with an electroluminescent layer and a color changing medium. A color changing medium in the organic electroluminescent display device of an embodiment of the present invention can be interposed between the substrate and the first electrode of the organic electroluminescent diode. Further, the organic electroluminescent layer can emit short wavelength light, such as blue light, The color changing medium together with an organic electroluminescent layer the can be used to create a full color displayed in the active matrix organic electroluminescent display device. A first embodiment of the present invention adopts electrode separators between the second electrodes. A second embodiment of the present invention uses a shadow mask to form the second electrodes such that there is a space between them.

FIG. 5 is a partial cross-sectional view of a top emission type organic electroluminescent display device showing one pixel according to a first embodiment of the present invention. As shown in FIG. 5, first and second substrates 110 and 130 are spaced apart from each other. Array elements 112 are formed on a front surface of the first substrate 110. A color change medium 136 having a black matrix 134 and red (R), green (G) and blue (B) color changing layers 132a, 132b, and 132c are formed on a rear surface of the second substrate 130. The black matrix 134 is formed on the second substrate 130 and defines sub-pixel regions. The red (R), green (G), and blue (B) color changing layers 132a, 132b and 132c are formed within the black matrix 134 to correspond to the sub-pixel regions, respectively. The black matrix 134 among the red (R), green (G) and blue color changing layers 132a, 132b and 132c prevents light leakage and cross color that is caused by color interference. The red (R), green (G), and blue (B) color changing layers 132a, 132b, and 132c and the black matrix 134 constitute the color changing medium (CCM) 136.

A planarizing layer 138 is formed on the rear surface of the color changing medium 136. A first electrode 140 of an organic electroluminescent diode E is disposed on the rear surface of the planarizing layer 138. The first electrode 140 is a transparent conductive material. A plurality of electrode separators 142 of insulating material are formed on the rear surface of the first electrode 140. Each of the electrode separators 142 correspond to the black matrix 134. The electrode separators 142 have a cross section with a trapezoid like tapered shape. In intervals among the plurality of taper-shaped electrode separators 142, an organic electroluminescent layer 144 and a second electrode 146 are sequentially formed. Thus, a sub-pixel region includes the organic electroluminescent layer 144 and the second electrode 146 which are separated from the organic electroluminescent layer 144 and the second electrode 146 of the next sub-pixel region by the electrode separator 142. In the alternative, the color changing medium 136 can include red, green and blue color filters instead of the color changing layers.

Still referring to FIG. 5, the electrode separators 142 are structural elements that make the second electrode 144 self-aligned to the organic electroluminescent layer 144. In addition, the electrode separators 142 pattern both the second electrode 144 and the organic electroluminescent layer 144d in each sub-pixel region. The electrode separators 142 can have a trapezoid like shape in that the bottom is wider than the top. In the peripheries of the first and second substrates 110 and 130, a seal pattern 160 is formed for attaching the first and second substrates 110 and 130. A cell gap I is formed between the first and second substrates 110 and 130. Array elements 112 on the first substrate 110 include thin film transistors 112a, which are switching elements, and a connecting patterns 112b, which are electrically connected to the thin film transistors 112a. An electrical connector 148 is formed in each sub-pixel region in order to electrically connect the connecting pattern 112b of the first substrate 110 to the second electrode 146 of the second substrate 130. The electrical connector 148 has a pillar shape and connects to both the connecting pattern 112b and the second electrode 146 of the organic electroluminescent diode E.

The connecting pattern 112b can be one of the drain and source electrodes of the thin film transistor 112a. Additionally, the connecting pattern 112b can be formed of any conductive material pattern. In the present embodiment, the thin film transistor 112a is the driving thin film transistor that is connected to the organic electroluminescent diode E.

In the embodiment shown in FIG. 5, the organic electroluminescent diode E is comprised of the first electrode 140, the organic electroluminescent layer 144, and the second electrode 146. The organic electroluminescent layer 144 emits blue light that has more energy than red, green, or blue light. The organic electroluminescent layer 144 can be a multiple-layer structure and the types depend on whether the first electrode 140 is anode or cathode. For example, if the first electrode is anode and the second electrode is cathode, the organic electroluminescent layer 144 includes a hole injection layer, a hole transporting layer, an emission layer, an electron transporting layer, and a electron transporting layer in series from the first electrode 140. In the alternative, if the organic electroluminescent layer 144 is a low molecular substance, the hole transporting layer, and the electron transporting layer can be omitted.

The organic electroluminescent display device shown in FIG. 5 is a top emission type that emits the light toward the second substrate 130 where the color changing medium 136 is disposed. Therefore, the first electrode 140 of the organic electroluminescent diode E is formed of a conductive material having a light-transmitting property. For example, if the first electrode 140 is anode, the first electrode is selected from the materials that have a small work function. Thus, a translucent material having the small work function is used as an anodic first electrode 140. Moreover, the second electrode 146 is formed of an opaque metallic material that can be beneficially reflective because it is disposed on the rear surface of the organic electroluminescent layer 144. For example, aluminum (Al), a magnesium-aluminum (Mg—Al) alloy, an aluminum-lithium (Al—Li) alloy, or an aluminum-benzonate compound can be utilized for the second electrode 146.

The electrical connector 148 electrically connects the connecting pattern 122b to the second electrode 146 of the organic electroluminescent diode E, as shown in FIG. 5. The electrical connector 148 is formed of a conductive material that has high ductility and low specific resistance. The electrical connector 148 can formed over the first substrate 110 after or during the fabrication process of the array elements. Subsequently, the electrical connector is connected to the second electrode 146 of the second substrate 130 when the first substrate 110 is attached to the second substrate 130 with the seal pattern 160. Inert gases can be interposed into the cell gap I between the first and second substrates 110 and 130 after they are attached.

Figure 6:
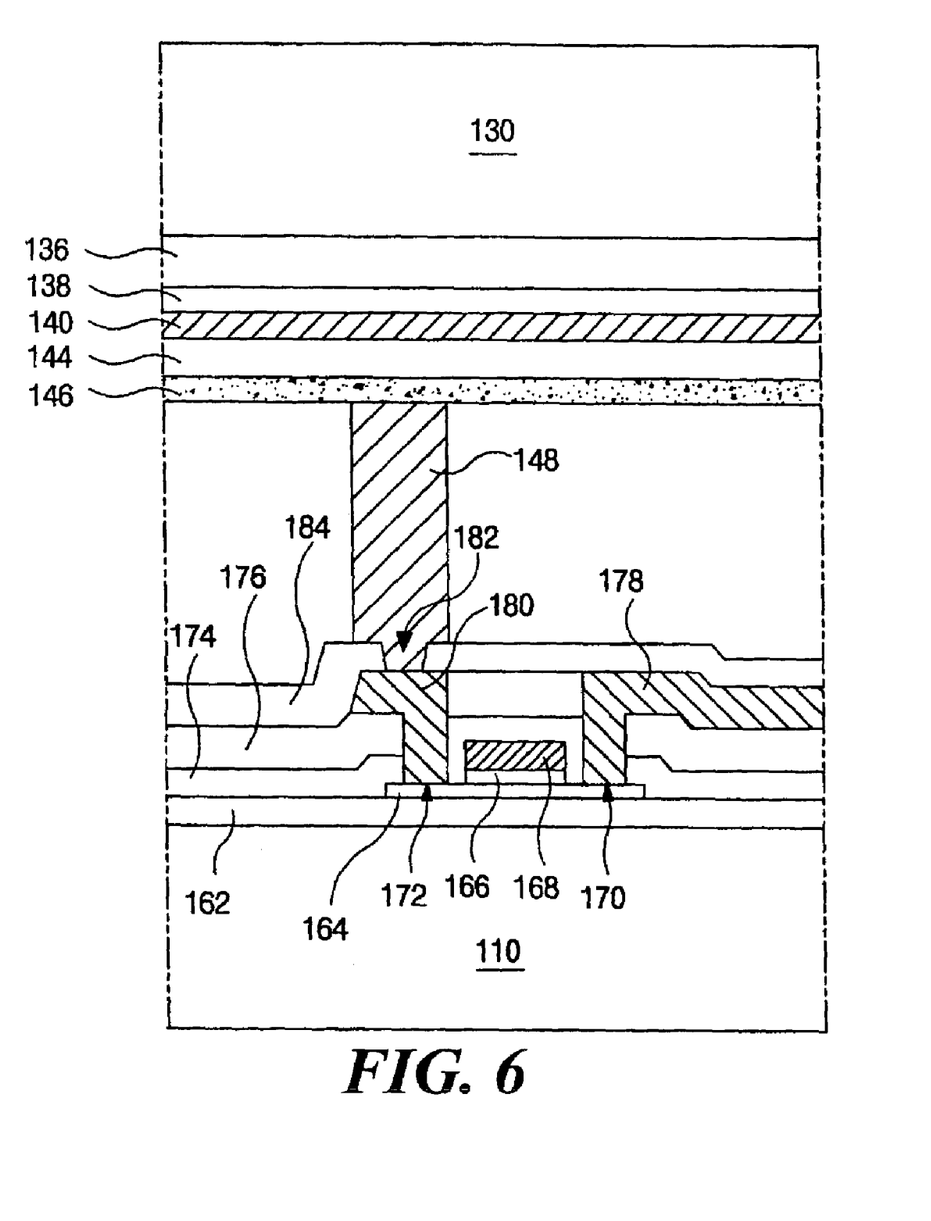
FIG. 6 is an enlarged partial cross-sectional view illustrating one sub-pixel of the organic electroluminescent display device of FIG. 5 according to present invention.

FIG. 6 is an enlarged partial cross-sectional view illustrating one sub-pixel region of the organic electroluminescent display device of FIG. 5 according to present invention. As shown in FIG. 6, the first and second substrates 110 and 130 are spaced apart from each other. A buffer layer 162 is formed on the first substrate 110, and a semiconductor layer 164 is formed on the buffer layer 162. A gate insulation layer 166 and a gate electrode 168 are sequentially formed on the center of the semiconductor layer 164. First and second passivation layers 174 and 176 are sequentially formed on the buffer layer 162 to cover the semiconductor layer 164, the gate insulation layer 166, and the gate electrode 168. The first and second passivation layers 174 and 176 have first and second contact holes 170 and 172 that respectively expose portions of the semiconductor layer 164. The first and second contact holes 170 and 172 are formed on both sides of the gate electrode 168. A source electrode 178 is formed on the second passivation layer 176, and contacts the semiconductor layer 164 through the first contact hole 170. Further, a drain electrode 180 is also formed on the second passivation layer 176 and contacts the semiconductor layer 164 through the second contact hole 172. A third passivation layer 184 is formed on the second passivation layer 176 to cover the source and drain electrodes 178 and 180, and has a third contact hole 182 that exposes a portion of the drain electrode 180. Although the third contact hole 182 is shown to expose the drain electrode 180 in FIG. 6, the third contact hole 182 can be formed to expose the source electrode 178 in the alternative. The electrical connector 148 is formed on the third passivation layer 184 and contacts the drain electrode 180 through the third contact hole 182. The electrical connector 148 has a pillar shape that is perpendicular to the first and second substrates 110 and 130.

The color changing medium 136, the planarizing layer 138, the first electrode 140, the organic electroluminescent layer 144, and the second layer 146 are sequentially formed on the rear surface of the second substrate 130. The second electrode 146 contacts the electrical connector 148, and thus the second electrode 146 is electrically connected to the drain electrode 180 by the electrical connector 148. In this embodiment, the drain electrode 180 is connected to the connecting pattern 112b of FIG. 5. However, the connecting pattern 112b of FIG. 5 can be either the drain or the source electrode depending on whether the semiconductor layer 164 is p-type or n-type. The semiconductor layer 164 should be p-type where the holes are used as carriers such that the first electrode 140 is cathode and the second electrode 146 is anode. Although not shown in FIG. 6, switching thin film transistors are disposed on the first substrate 110, and then these switching thin film transistors are connected to scanning lines and signal lines. Power supply lines are also formed over the first substrate 110 and storage capacitors are formed in the sub-pixel regions.

Figure 7:
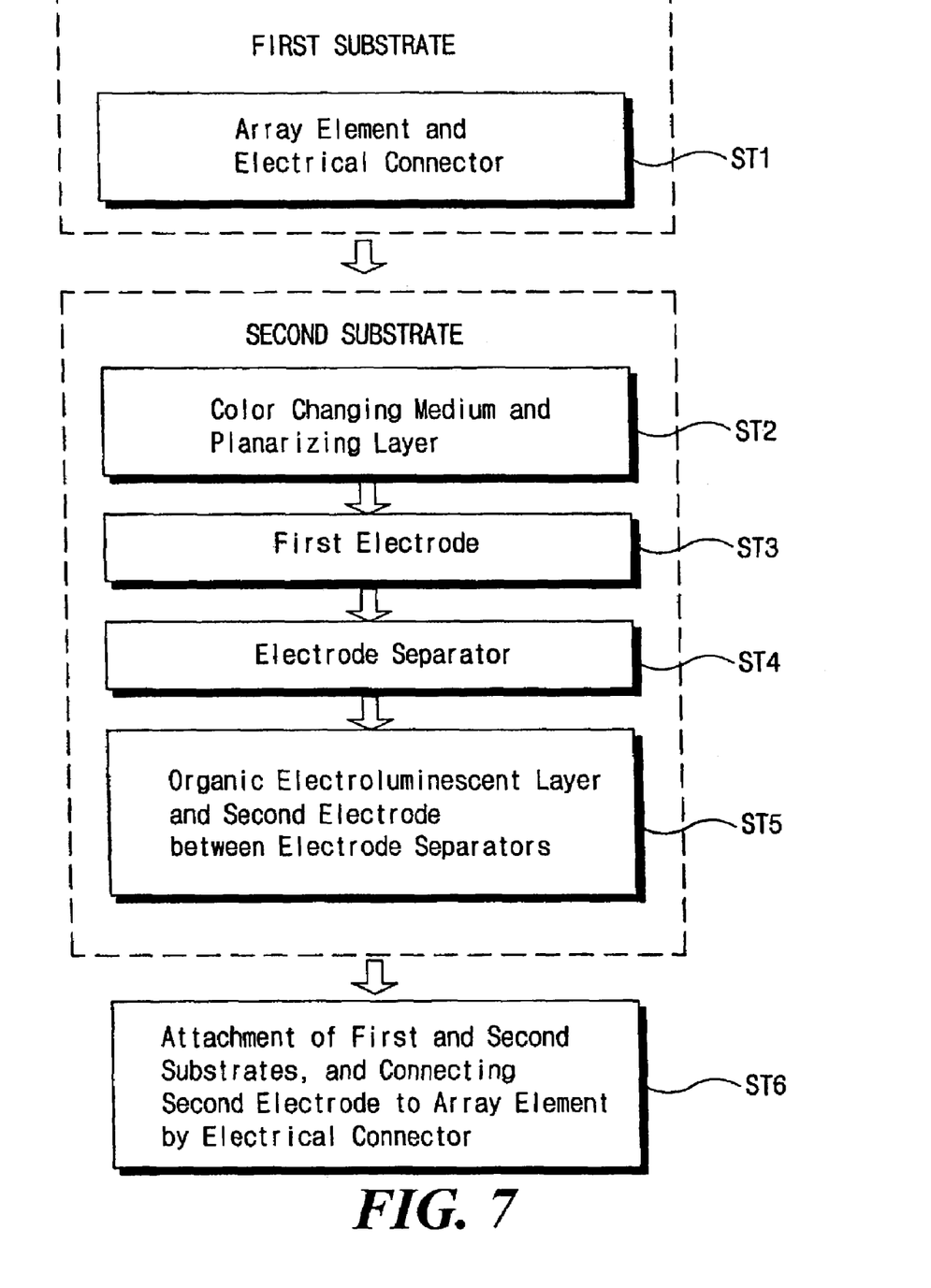
FIG. 7 is a flow chart illustrating a fabrication process of the organic electroluminescent display device shown in FIG. 5 according to present invention.

FIG. 7 is a flow chart illustrating a fabrication process of the organic electroluminescent display device shown in FIG. 5 according to present invention. Referring to step ST1 of FIG. 7, array elements and electrical connectors are formed on a first substrate. Forming the array elements includes depositing a buffer layer on the first substrate followed by a semiconductor layer and a capacitor electrode being deposited on the buffer layer. Gate, source, and drain electrodes are formed for a plurality of switching devices. In addition, insulator layers, scanning lines, signal lines, and power supply lines are formed above the buffer layer. While forming array elements, a connecting pattern is formed that connects to the switching devices. The connecting pattern is connected to a electrical connector formed on the first substrate. The electrical connector has a predetermined height and is formed such that it is connected to the source or drain electrode via the connecting pattern. The electrical connector could be formed on the organic electroluminescent diode. However, photolithography processes used to form the electrical connector on the organic electroluminescent diode can cause damage to the organic electroluminescent layer of the organic electroluminescent diode.

Referring to step ST2 of FIG. 7, a color changing medium and a planarizing layer are sequentially formed on the second substrate. Forming the color changing medium includes forming a black matrix on the second substrate that defines sub-pixel regions. The red, green, and blue color changing layers are formed within the black matrix in respective sub-pixel regions. For example, a conventional pigment dispersion method can be used in forming the filters. Further, the red, green, and blue color changing layers can include the red, green, and blue color filters. In the case of using color filters, the layer-formation order is the black matrix, the color filters, and the color changing layers in series. Subsequently, a planarizing layer, which can be a multi-layered structure having at least an insulator, is positioned on the color changing medium.

In step ST3 of FIG. 7, a first electrode of the organic electroluminescent diodes is formed on the planarizing layer. The first electrode is beneficially formed of a transparent conductive material.

In step ST4, electrode separators are formed on the first electrode corresponding to the black matrix. The electrode separators are disposed under the black matrix and have are tapered with a cross section that has a trapezoid like shape. In addition, the electrode separators form intervals corresponding to the sub-pixel regions.

In step ST5, organic electroluminescent layers and second electrode are sequentially formed on the first electrode and into the intervals between the electrode separators. Thus, the organic electroluminescent layer and the second electrode are located in each sub-pixel region. Adjacent organic electroluminescent layers are separated by the electrode separators. In addition, adjacent second electrodes are separated by the electrode separators. The organic electroluminescent layer includes a blue-emitting layer to provide blue light to the red, green and blue color changing layers so that the red, green, and blue color changing layers convert the provided blue light into three primary colors of red, green, and blue. The organic electroluminescent layer also includes high or low molecular organic material to transport the holes or electrons, respectively.

In step ST6, a seal pattern is formed on the periphery of one of the first and second substrates. Thereafter, the first and second substrates are aligned and attached to each other by the seal pattern, and simultaneously, the electrical connector of the first substrate is connected to the second electrode of the second substrate. Therefore, the array elements of the first substrate are electrically connected to the organic electroluminescent diode of the second substrate. More specifically, the driving thin film transistor formed on the first substrate is electrically connected to the organic electroluminescent diode formed on the second substrate. Further in step ST6, inert gases are interposed in a cell gap between the first and second substrates when attaching the first substrate to the second substrate. Both the process of attaching the first and second substrates while electrically connecting the thin film transistor to the organic electroluminescent diode and the process of inserting the inert gases into the cell gap are called "Insulation Process."

Furthermore, during the process step ST6, a hydroscopic material, such as a moisture absorbent material, can be deposited on the first or second substrate adjacent to the seal pattern, in order to protect the organic electroluminescent layer from the humid air and moist outer atmosphere. Additionally, the hydroscopic material can be formed in a line along the seal pattern.

In the embodiments of the present invention, the array elements and the organic electroluminescent diode are formed on different substrates, respectively. Therefore, although the defects occur in the array elements and organic electroluminescent diode during the fabrication processes, the substrate having the defects can be easily replaced by the other defect-free substrate. Only tested-good substrates, that is, the first substrate having defect-free array elements and the second substrate having defect-free organic electroluminescent diodes, are attached to each other. As a result, it is possible to improve efficiency of production control such that a reduction of the defect ratio or increase yield is obtained.

In the first embodiment discussed with references to FIGS. 5–7, since the electrode separators are utilized between the sub-pixel regions, the organic electroluminescent layer and second electrode of the organic electroluminescent diode are automatically patterned and aligned for each sub-pixel region. Thus, a shadow mask process is not required. Since the organic electroluminescent layer emits the short wavelength blue light and the red, green, and blue color changing layers are adopted to display the primary colors of red, green, and blue, the process of forming the organic electroluminescent diode is be simplified.

Figure 8:
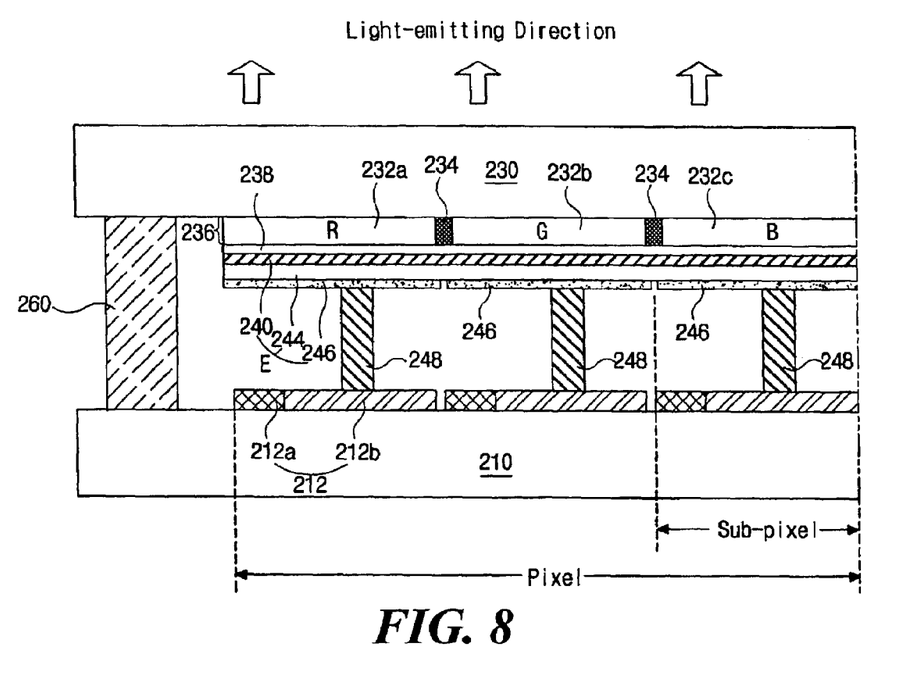
FIG. 8 is a partial cross-sectional view of a top emission type organic electroluminescent display device showing one pixel according to a second embodiment of the present invention.

FIG. 8 is a partial cross-sectional view of a top emission type organic electroluminescent display device showing one pixel according to a second embodiment of the present invention. The second embodiment shown in FIG. 8 is similar to the first embodiment shown in FIGS. 5 and 6, and thus, some detailed explanations are omitted to prevent duplicative explanations. As shown in FIG. 8, first and second substrates 210 and 230 are spaced apart from each other. Array elements 212 that include thin film transistors 212a and connecting patterns 212b are formed on a front surface of the first substrate 210. A color change medium 236 having a black matrix 234 and red (R), green (G), and blue (B) color changing layers 232a, 232b, and 232c is formed on a rear surface of the second substrate 130. The black matrix defines sub-pixel regions. The red (R), green (G), and blue (B) color changing layers 232a, 232b, and 232c correspond to sub-pixel regions, respectively. The black matrix 234 is formed on the rear surface of the second substrate 230 among the red (R), green (G), and blue color changing layers 232a, 232b, and 232c. A planarizing layer 238 is formed on the rear surface of the color changing medium 236. A first electrode 240 of organic electroluminescent diodes E is disposed on the rear surface of the planarizing layer 238. Further, an organic electroluminescent layer 244 is formed on the rear surface of the first electrode 240 for the organic electroluminescent diodes E. Second electrodes 246 are formed on the rear surface of the organic electroluminescent layer 244 that respectively correspond to the sub-pixel regions. In addition, the second electrodes 246 correspond to the color changing layer 232 and the array element 212 in their respective sub-pixel regions.

When forming the second electrodes 246, a shadow mask is utilized and thus the second electrodes 246 are separated by a space without the electrode separators. Namely, unlike the first embodiment, the electrode separators 142 of FIG. 5 separating the organic electroluminescent layer and the second electrode are not utilized in the second embodiment. The first electrode 240, the second electrodes 246 and the organic electroluminescent layer 244 interposed between the first electrode 240 and the second electrodes 246 constitute the organic electroluminescent diodes E in all of the sub-pixel regions.

At the peripheries of the first and second substrates 210 and 230, a seal pattern 260 attaches the first and second substrates 210 and 230 such that a cell gap is formed between the first and second substrates 210 and 230. Array elements 212 formed on the first substrate 210 include thin film transistors 212a and connecting patterns 212b that electrically connected to the thin film transistors 212a. Furthermore, an electrical connector 248 is connected to the connecting pattern in each sub-pixel region for electrically connecting the connecting pattern 212b of the first substrate 210 to the second electrode 246 of the second substrate 230. The electrical connector 248 has a pillar shape that is connected to both the connecting pattern 212b of a thin film transistor 212a and the second electrode 246 of the organic electroluminescent diode E. A detailed explanation of the array elements 212 is omitted because they are the same array elements as those described in reference to FIG. 6.

Figure 9:
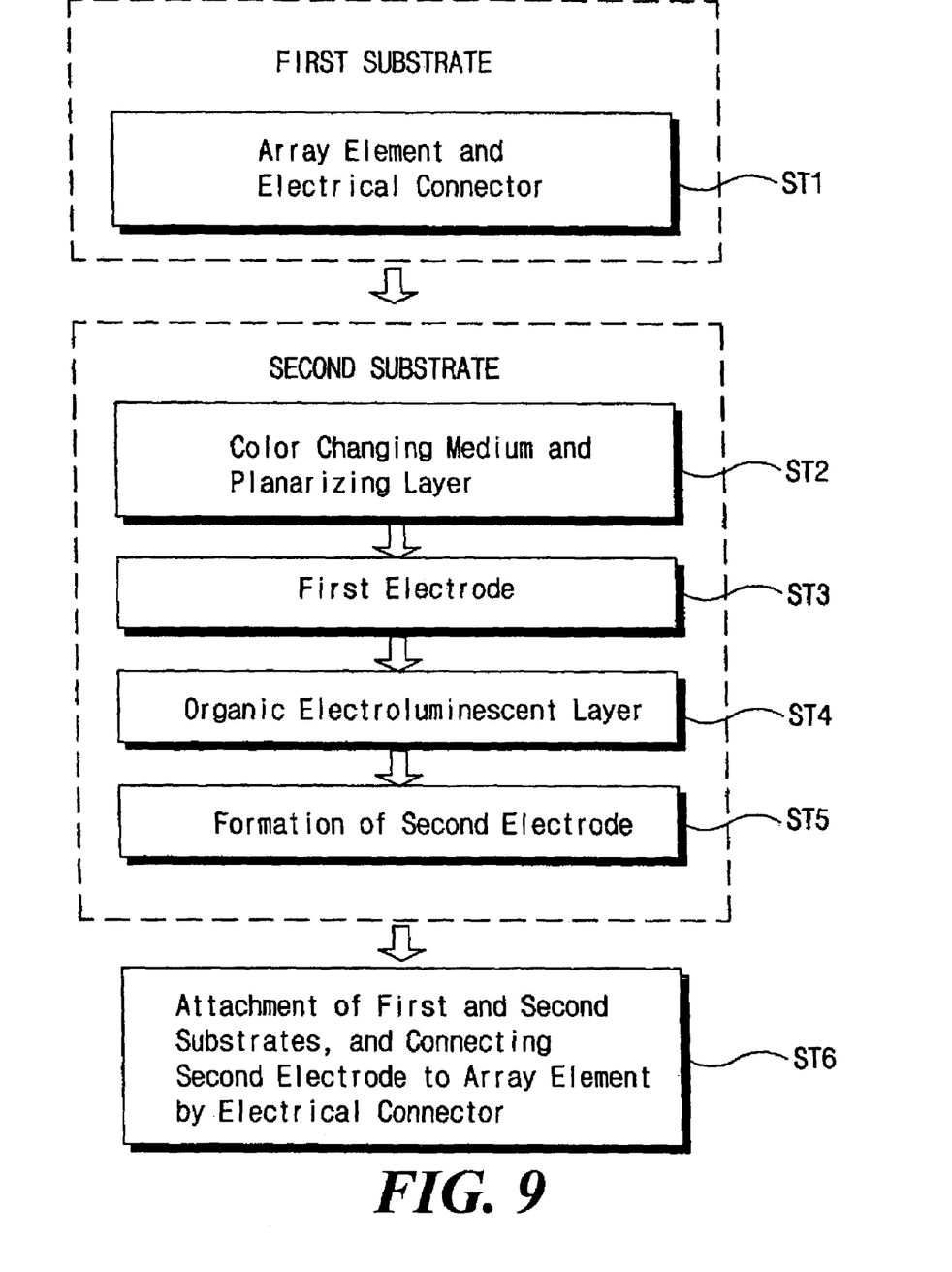
FIG. 9 is a flow chart illustrating a fabrication process of the organic electroluminescent display device shown in FIG. 8 according to present invention.

FIG. 9 is a flow chart illustrating a fabrication process of the organic electroluminescent display device shown in FIG. 8 according to present invention. Because this fabrication process illustrated with reference to FIG. 9 is a bit similar to that of FIG. 7, some detailed explanations are omitted. Referring to step ST1 of FIG. 7, array elements are formed on the first substrate. Forming the array elements includes depositing a buffer layer on the first substrate followed by the formation of a semiconductor layer and a capacitor electrode on the buffer layer. Gate, source, and drain electrodes are formed for a plurality of switching devices. In addition, insulator layers, scanning lines, signal lines, and power supply lines are formed above the buffer layer. While forming array elements, a connecting pattern is formed that connects to the switching devices. The connecting pattern is connected to a electrical connector formed on the first substrate. Further, the electrical connector has a pillar shape of a predetermined height and is formed to be connected to the source or drain electrode of a switching device through the connecting pattern.

In step ST2 of FIG. 9, a color changing medium and a planarizing layer are sequentially formed on the second substrate. Forming the color changing medium includes forming a black matrix on the second substrate in the boards of sub-pixel regions and forming red, green, and blue color changing layers on the exposed portions of the second substrate.

In step ST3 of FIG. 9, a first electrode of the organic electroluminescent diode is formed on the planarizing layer. The first electrode is beneficially a transparent conductive material.

In step ST4 of FIG. 9, an organic electroluminescent layer is formed on the entire surface of the first electrode. The organic electroluminescent layer includes blue-emitting layer to provide blue light to the red, green and blue color changing layers so that the red, green, and blue color changing layers convert the provided blue light into the primary colors of red, green, and blue.

Referring to step ST5 of FIG. 9, a second electrode is formed on the organic electroluminescent layer using a shadow mask process. The shadow mask is used in depositing a material such that second electrodes are deposited with a space in between them. The second electrodes respectively correspond to the sub-pixel regions.

In step ST6 of FIG. 9, a seal pattern is formed on the periphery of one of the first and second substrates. Thereafter, the first and second substrates are aligned and attached to each other by the seal pattern, and simultaneously, the electrical connector of the first substrate is connected to the second electrode of the second substrate. Therefore, the array elements of the first substrate are electrically connected to the organic electroluminescent diode of the second substrate. Specifically, the driving thin film transistor formed on the first substrate is electrically connected to the organic electroluminescent diode formed on the second substrate. Further in step ST6 of FIG. 9, inert gases are interposed into a cell gap between the first and second substrates and into the space between the second electrodes when attaching the first substrate to the second substrate.

As described herein, embodiments of the present invention provide array elements on a first substrate and an organic electroluminescent device on a second substrate. The first substrate having the array elements and the second substrate having the organic electroluminescent device are fabricated separately and then these substrates are attached after an inspection determines whether the array elements on the first substrate or the organic electroluminescent device on the second substrate have any defects. If the first substrate having the array elements or the second substrate having the organic electroluminescent device is found to have any defects, each substrate can be easily replaced by an other defect-free substrate. Therefore, a satisfactory and reliable organic electroluminescent display device can be obtained according to the present invention in a fabrication process having high productivity. Further, since the organic electroluminescent display device in accordance with embodiments of the present invention is a top emission type where the emitted light is toward opposite to the substrate having the thin film transistors, the aperture ratio can be improved and it is easy to manufacture a thin film transistor having a designated shape. An improved resolution and long-time life span of the organic electroluminescent display device can also be obtained. Since embodiments of the present invention use a color changing medium instead of different types of organic electroluminescent layers, the fabrication process can be simplified. Due to the attachment of the first and second substrates with a sealing pattern, the outer moist atmosphere can not easily affect the organic electroluminescent device.

It will be apparent to those skilled in the art that various modifications and variation can be made in the organic electroluminescent device of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   first and second substrates attached by a seal pattern:
   array elements including a plurality of switching devices on the first substrate;
   a color changing medium on a rear surface of the second substrate, wherein the color changing medium has a black matrix that defines sub-pixel regions and has red, green, and blue color changing layers respectively corresponding to the sub-pixel regions;
   a planarizing layer being continuous and on the color changing medium;
   a first electrode on a rear surface of the planarizing layer;
   an organic electroluminescent layer on a rear surface of the first electrode;
   second electrodes on a rear surface of the organic electroluminescent layer that correspond to respective sub-pixel regions; and
   a plurality of electrical connectors between the first and second substrates, wherein the plurality of electrical connectors connect the array elements on the first substrate to the second electrodes on the second substrate, respectively, and wherein the plurality of electrical connectors include a material different from the second electrodes.

2. The device according to claim 1, wherein the organic electroluminescent layer emits short wavelength light and the primary colors of red, green, and blue light are emitted by the organic electroluminescent device.

3. The device according to claim 1, further comprising an electrode separator on the rear surface of the first electrode, wherein the electrode separator corresponds in position to the black matrix and separates the organic electroluminescent layer and the second electrode of one sub-pixel region from another sub-pixel region.

4. The device according to claim 3, wherein each electrode separator has a trapezoid like shaped taper.

5. The device according to claim 1, further comprising a space in between second electrodes of adjacent sub-pixel regions.

6. The device according to claim 1, wherein the plurality of electrical connectors are formed of a metal having high ductility and low specific resistance.

7. The device according to claim 1, wherein the first electrode is made of a transparent conductive material and the second electrode is made of an opaque metallic material.

8. The device according to claim 1, wherein the first electrode is an anode and the second electrode is a cathode.

9. The device according to claim 1, wherein the array element includes a connecting pattern that is connected to the switching device and the electrical connector.

10. The device according to claim 9, wherein the switching device includes a gate electrode, a semiconductor layer, a drain electrode, and a source electrode.

11. The device according to claim 10, wherein one of the drain and source electrodes becomes the connecting pattern that is electrically connected to the second electrode through the electrical connector.

12. The device according to claim 1, wherein the organic electroluminescent layer includes an organic material that transports and injects one of holes and electrons.

13. The device according to claim 1, wherein the first electrode, the organic electroluminescent layer and the second electrode constitute an organic electroluminescent diode that emits short wavelength blue light in a direction toward the second substrate.

14. The device according to claim 1, wherein a cell gap between the first and second substrates, and the space between second electrodes contains an inert gas.

15. An organic electroluminescent device, comprising:
    first and second substrates attached by a seal pattern:
    array elements including a plurality of switching devices on the first substrate;
    a color changing medium on a rear surface of the second substrate, wherein the color changing medium has a black matrix that defines sub-pixel regions and has red, green, and blue color changing layers respectively corresponding to the sub-pixel regions;
    a planarizing layer on the color changing medium;
    a first electrode on a rear surface of the planarizing layer;
    an organic electroluminescent layer on a rear surface of the first electrode;
    second electrodes on a rear surface of the organic electroluminescent layer that correspond to respective sub-pixel regions; and
    a plurality of electrical connectors between the first and second substrates, wherein the electrical connectors connect the array elements to the second electrodes and create a cell gap between the first and second substrates.

* * * * *